(12) United States Patent
Standing et al.

(10) Patent No.: US 8,097,938 B2
(45) Date of Patent: Jan. 17, 2012

(54) CONDUCTIVE CHIP-SCALE PACKAGE

(75) Inventors: Martin Standing, Tonbridge (GB); Robert J Clarke, East Peckham (GB)

(73) Assignee: International Rectifier Corporation, El Segundo, CA (US)

( * ) Notice: Subject to any disclaimer, the term of this patent is extended or adjusted under 35 U.S.C. 154(b) by 35 days.

(21) Appl. No.: 12/405,577

(22) Filed: Mar. 17, 2009

(65) Prior Publication Data

US 2009/0174058 A1 Jul. 9, 2009

Related U.S. Application Data

(62) Division of application No. 11/405,801, filed on Apr. 18, 2006, now Pat. No. 7,524,701.

(60) Provisional application No. 60/673,160, filed on Apr. 20, 2005.

(51) Int. Cl.
*H01L 23/495* (2006.01)

(52) U.S. Cl. .............. 257/676; 257/712; 257/E23.01; 257/E23.192

(58) Field of Classification Search ............ 257/712, 257/734, 704, 706, 720, 675, 787–790, 792, 257/795, 796, E31.117, E31.118, E51.03, 257/E23.116
See application file for complete search history.

(56) References Cited

U.S. PATENT DOCUMENTS

| | | |
|---|---|---|
| 3,561,107 A | 2/1971 | Best et al. |
| 3,871,014 A | 3/1975 | King et al. |
| 3,972,062 A | 7/1976 | Hopp |
| 4,021,838 A | 5/1977 | Warwick |
| 4,454,454 A | 6/1984 | Valentine |
| 4,604,644 A | 8/1986 | Beckham et al. |
| 4,639,760 A | 1/1987 | Granberg et al. |
| 4,646,129 A | 2/1987 | Yerman et al. |
| 4,835,208 A | 5/1989 | Ball |
| 5,075,759 A | 12/1991 | Moline |
| 5,182,632 A | 1/1993 | Bechtel et al. |
| 5,217,922 A | 6/1993 | Akasaki et al. |
| 5,311,402 A | 5/1994 | Kobayashi et al. |
| 5,313,366 A | 5/1994 | Gaudenzi et al. |
| 5,367,435 A | 11/1994 | Andros et al. |
| 5,371,404 A | 12/1994 | Juskey et al. |
| 5,381,039 A | 1/1995 | Morrison |
| 5,394,490 A | 2/1995 | Kato et al. |
| 5,397,921 A | 3/1995 | Karnezos |
| 5,447,886 A | 9/1995 | Rai |
| 5,448,114 A | 9/1995 | Kondoh et al. |
| 5,454,160 A | 10/1995 | Nickel |
| 5,455,456 A | 10/1995 | Newman |

(Continued)

FOREIGN PATENT DOCUMENTS

DE 10 2004 055 817 B3 1/2006

(Continued)

OTHER PUBLICATIONS

Mosfet BGA Design Guide 2004, Fairchild Semiconductor.

(Continued)

*Primary Examiner* — A. Sefer
*Assistant Examiner* — Dilinh Nguyen
(74) *Attorney, Agent, or Firm* — Farjami & Farjami LLP

(57) ABSTRACT

A method for manufacturing a semiconductor package that includes forming a frame inside a conductive can, the frame being unwettable by liquid solder.

15 Claims, 5 Drawing Sheets

U.S. PATENT DOCUMENTS

| | | |
|---|---|---|
| 5,477,087 A | 12/1995 | Kawakita et al. |
| 5,510,758 A | 4/1996 | Fujita et al. |
| 5,512,786 A | 4/1996 | Imamura et al. |
| 5,532,512 A | 7/1996 | Fillion et al. |
| 5,554,887 A | 9/1996 | Sawai et al. |
| 5,578,869 A | 11/1996 | Hoffman et al. |
| 5,654,590 A | 8/1997 | Kuramochi |
| 5,703,405 A | 12/1997 | Zeber |
| 5,726,489 A | 3/1998 | Matsuda et al. |
| 5,726,501 A | 3/1998 | Matsubara |
| 5,726,502 A | 3/1998 | Beddingfield |
| 5,729,440 A | 3/1998 | Jimarez et al. |
| 5,734,201 A | 3/1998 | Djennas et al. |
| 5,739,585 A | 4/1998 | Akram et al. |
| 5,814,894 A | 9/1998 | Igarashi et al. |
| 5,841,183 A | 11/1998 | Ariyoshi |
| 6,051,888 A | 4/2000 | Dahl |
| 6,133,634 A | 10/2000 | Joshi |
| 6,303,974 B1 | 10/2001 | Irons et al. |
| 6,306,680 B1 | 10/2001 | Fillion |
| 6,391,687 B1 | 5/2002 | Cabahug et al. |
| 6,538,305 B2 | 3/2003 | Ichinose |
| 6,624,522 B2 | 9/2003 | Standing et al. |
| 6,677,669 B2 | 1/2004 | Standing |
| 6,720,647 B2 | 4/2004 | Fukuizumi |
| 6,744,124 B1 | 6/2004 | Chang et al. |
| 6,830,959 B2 | 12/2004 | Estacio |
| 6,943,434 B2 | 9/2005 | Tangpuz |
| 7,122,887 B2 | 10/2006 | Standing |
| 7,402,507 B2 | 7/2008 | Standing |
| 2001/0048116 A1* | 12/2001 | Standing et al. ............. 257/177 |
| 2003/0001247 A1 | 1/2003 | Standing |
| 2004/0106703 A1* | 6/2004 | Etzrodt et al. ............... 523/330 |
| 2004/0140551 A1 | 7/2004 | Usui et al. |
| 2005/0014313 A1 | 1/2005 | Workman et al. |

FOREIGN PATENT DOCUMENTS

| | | |
|---|---|---|
| EP | 0 966 038 | 12/1999 |
| EP | 0 978 871 | 2/2000 |
| JP | 5-129516 | 5/1993 |
| JP | 5-315398 | 11/1993 |
| JP | 6-120225 | 4/1994 |
| JP | 07-202064 | 8/1995 |
| JP | 11-054673 | 2/1999 |
| JP | 11195680 | 7/1999 |
| JP | 2000-243887 | 9/2000 |
| WO | WO 99/65077 | 12/1999 |

OTHER PUBLICATIONS

Supplementary European Search Report dated Sep. 28, 2007 in European Patent Application No. 01922828.7.

* cited by examiner

CONDUCTIVE CHIP-SCALE PACKAGE

RELATED APPLICATION

This application is a divisional of U.S. patent application Ser. No. 11/405,801 filed Apr. 18, 2006 and entitled CHIP SCALE PACKAGE, which claims the benefit of U.S. Provisional Application Ser. No. 60/673,160, filed on Apr. 20, 2005, entitled SOLDER MASK INSIDE DIRECT FET CAN, to which a claim of priority is hereby made and the disclosure of which is incorporated by reference.

BACKGROUND OF THE INVENTION

The present invention relates to power semiconductor packages and methods of manufacturing power semiconductor packages.

Referring to FIGS. 1-4, a package 10 according to the prior art includes a conductive can 12, and a power semiconductor die 14. Can 12 is typically formed with an electrically conductive material such as copper or a copper-based alloy, and may be coated with silver, gold or the like. Die 14 may be a vertical conduction type power semiconductor MOSFET having its drain electrode 16 electrically and mechanically attached to an interior surface of can 12 by a conductive adhesive 18 such as solder or a conductive epoxy (e.g. silver epoxy). Source electrode 20, and gate electrode 22 of die 14 (which are disposed on a surface opposite to the drain electrode) each includes a solderable body which facilitates its direct connection to a respective conductive pad 24, 26 of a circuit board 28 by a conductive adhesive (e.g. solder or conductive epoxy) as illustrated by FIG. 4. Note that die 14 further includes passivation body 30 which partially covers source electrode 20 and gate electrode 22, but includes openings to allow access at least to the solderable portions thereof for electrical connection. Further note that in package 10 conductive can 12 includes web portion 13 (to which die 14 is electrically and mechanically connected), wall 15 surrounding web portion 13, and two oppositely disposed rails 32 extending from wall 15 each configured for connection to a respective conductive pad 34 on circuit board 28. Also, note that die 14 is spaced from wall 15 of can 12; i.e. wall 15 surrounds die 14. Thus, a moat 36 is present between die 14 and wall 15.

In a package according to the prior art, source electrode 20, and gate electrode 22 are soldered down by the user. Specifically, the user applies solder to, for example, the pads of a circuit board, and the electrodes of the die are attached to the pads by the solder so placed.

A package as described above is disclosed in U.S. Pat. No. 6,624,522.

To fabricate a package as described above, a solder is applied to drain electrode 16 of die 14, die is placed inside can 12, and the solder is reflown. Alternatively, solder is applied to the interior surface of web portion 13 of can 12, drain electrode 16 of die 14 is placed on the solder, and the solder is reflown. In each case, once the solder is reflown, there is a possibility that die 14 may move from its position as placed or become misaligned relative to its orientation as placed. As a result, the quality of the final product may be adversely affected.

SUMMARY OF THE INVENTION

In a process according to the present invention, a frame is formed inside a conductive can which is not capable of being wet by solder in liquid phase. The frame so formed defines a die receiving area. A solder paste mass is interposed between the die receiving area and the electrode of a die and reflown. That is, the solder paste may be deposited inside the can and the die placed thereon, or the die may have the solder paste deposited thereon and placed inside the can. Because the frame cannot be wet by the reflown solder (which is in liquid phase), it is contained within the boundary of the frame. As a result, the die is prevented from moving inside the can during the reflow process.

In one embodiment of the present invention, the frame is made from solder resist material, which is preferably based on a polymer. If so, the frame may be formed through stenciling or drop-on-demand deposition.

In another embodiment of the present invention, the frame may be made from a passivation material such as an oxide. If so, in one preferred embodiment, the die receiving area is covered, and the area which is not covered is rendered passive and unwettable by liquid solder, for example, by oxidation. The covering is then removed to expose the die receiving area.

It has been observed that a frame formed according to the present invention improves the placement accuracy of the die in a can. Furthermore, it has been observed that the die can be effectively centered within the can and aligned with the sidewalls of the can.

In another embodiment, a dielectric material with high thermal absorption characteristics is deposited on the exterior surface of the can. The dielectric material may be a polymer which can be drop-on-demand deposited onto the exterior surface of the can. To enhance the absorption capability of the dielectric, it may be pigmented with dark or black pigments.

Other features and advantages of the present invention will become apparent from the following description of the invention which refers to the accompanying drawings.

DETAILED DESCRIPTION OF EMBODIMENTS OF THE INVENTION

Figure 1:
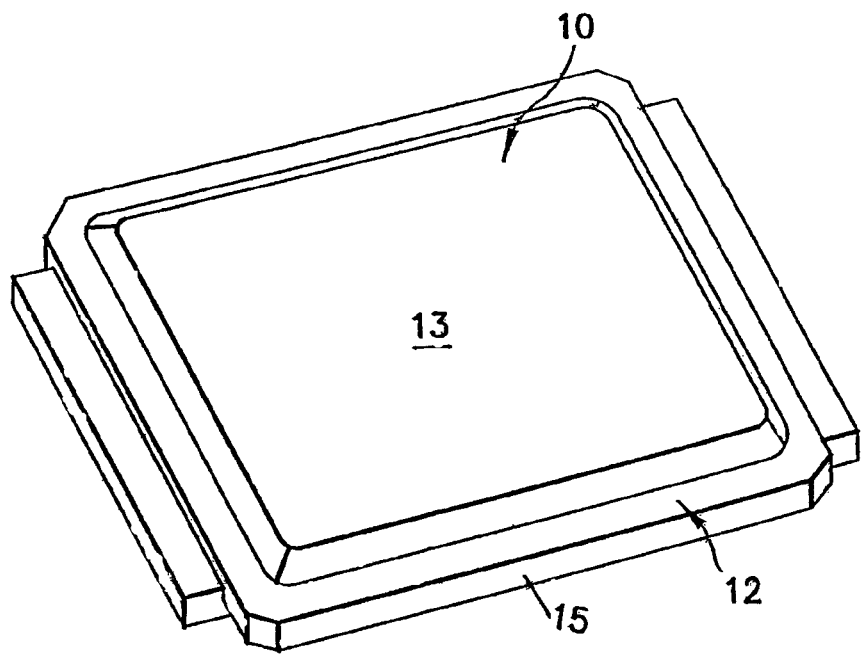
FIG. 1 is a perspective view of a package according to prior art.
Figure 2:
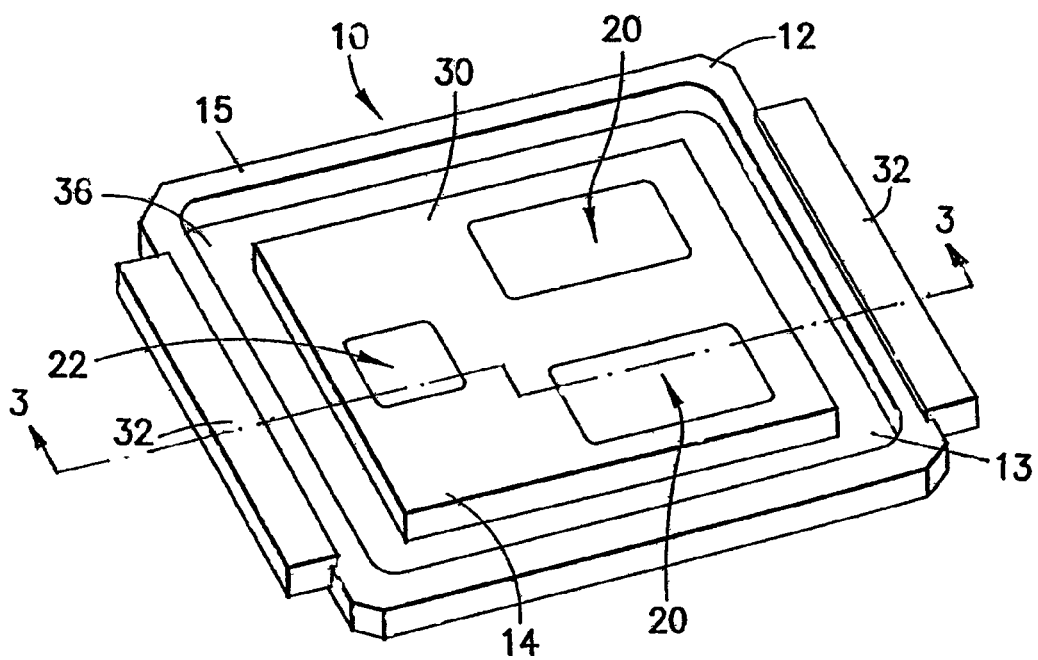
FIG. 2 is another perspective view of the package of FIG. 1.
Figure 3:
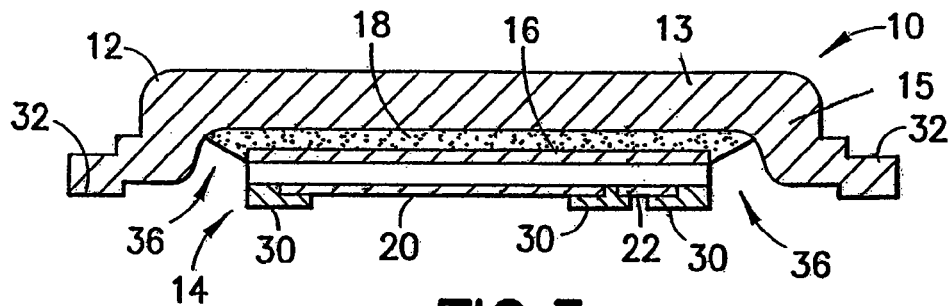
FIG. 3 is a cross-sectional view of the package of FIG. 1 along line 3-3 in FIG. 2.
Figure 4:
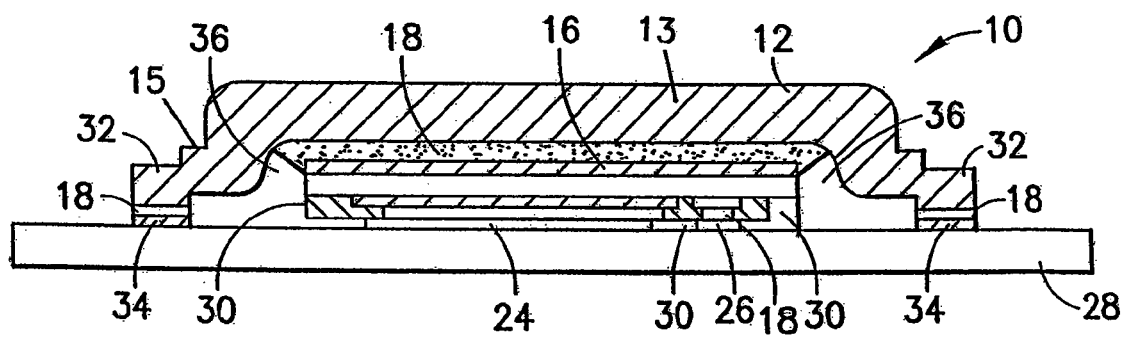
FIG. 4 shows the package of FIG. 1 as assembled on a circuit board.
Figure 5:
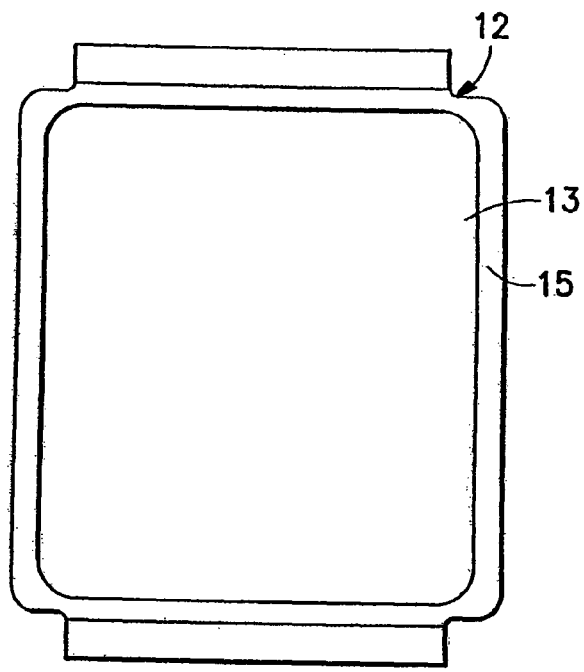
FIG. 5 shows a top plan view of the inside of a can.
Figure 6:
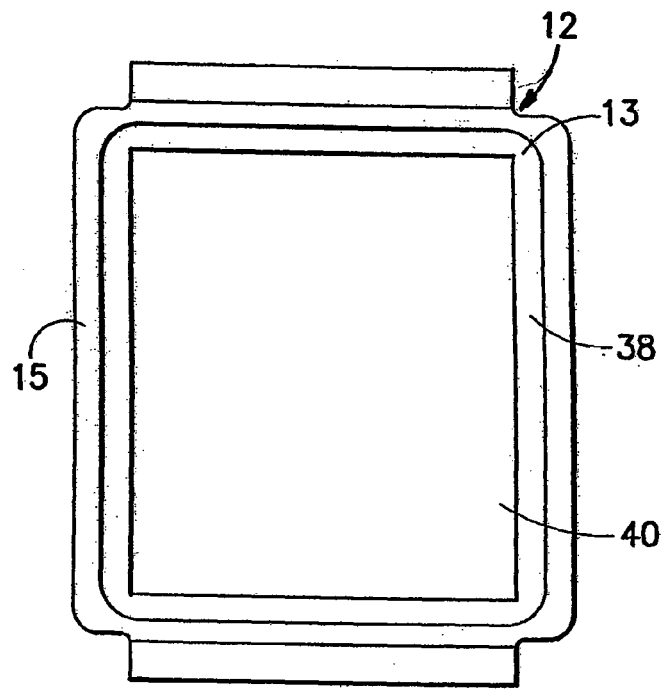
FIG. 6 shows the can of FIG. 5 after receiving a frame according to the present invention.
Figure 7:
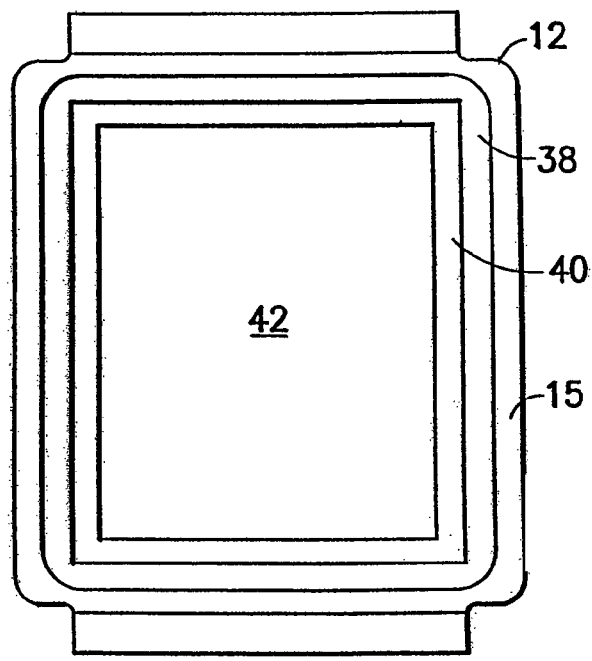
FIG. 7 shows the can of FIG. 6 after receiving a solder paste mass in the die receiving area thereof.
Figure 8:
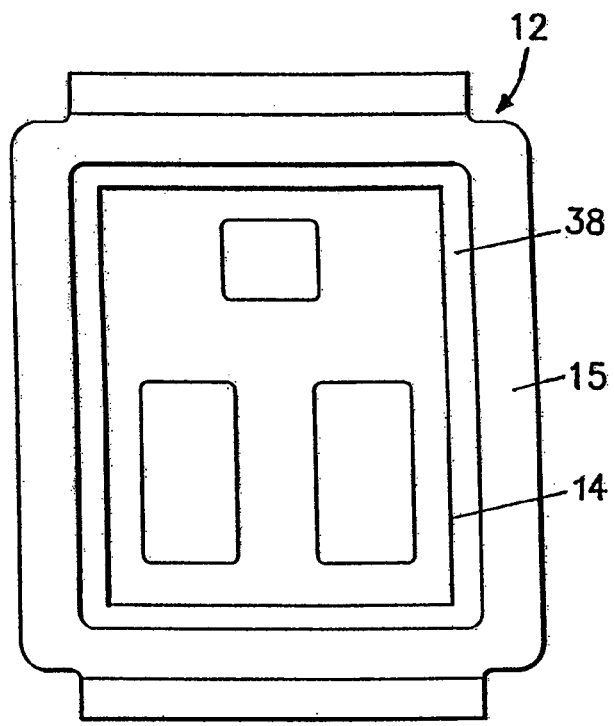
FIG. 8 shows can of FIG. 7 after receiving a die.
Figure 9:
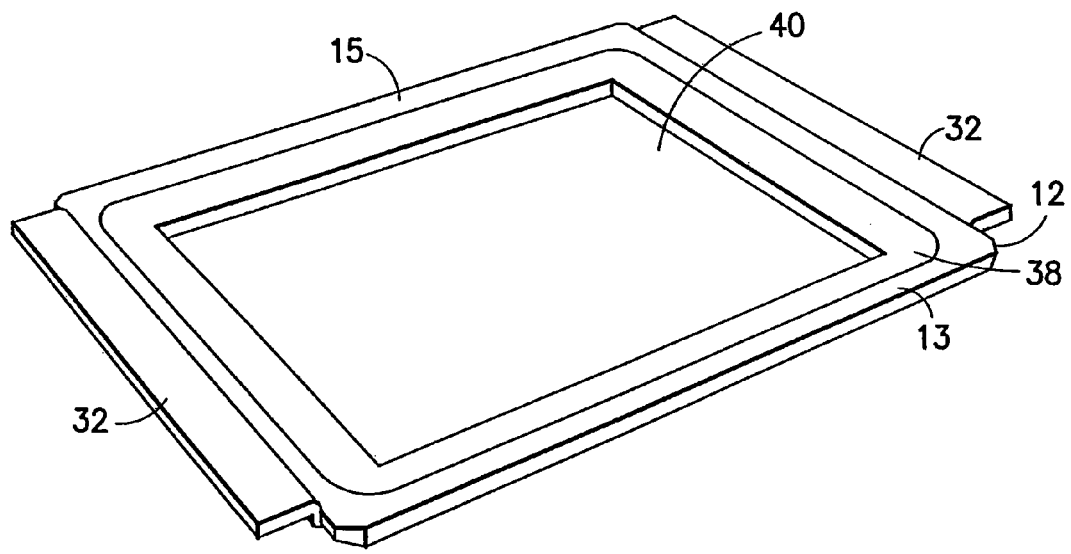
FIG. 9 shows a perspective view of the can as shown in FIG. 6.

Referring next to FIGS. 5-8, in a method according to the present invention at least interior surface of web portion 13 of can 12 receives a frame 38 (see FIG. 6). Frame 38 defines a die receiving area 40 inside can 12 on web portion 13 for receiving a semiconductor die, for example, semiconductor die 14 according to the prior art. Next, according to a preferred embodiment, a solder paste mass 42 is deposited on receiving area 40 as illustrated by FIG. 7. Thereafter, a semiconductor die is disposed on solder paste mass 42, and the solder is reflown by heating the arrangement to at least the reflow temperature of solder paste mass 42. Next, the arrangement is cooled whereby the reflown solder paste is hardened to form a conductive adhesive body 18.

In a process according to an alternative embodiment, solder paste is deposited on an electrode of a semiconductor die, and the die is placed on receiving area 40 with the solder paste disposed between the electrode of the die and receiving area 40. Thereafter, the arrangement is subjected to heat in order to reflow the solder paste, followed by a cooling step to solidify the reflown solder. Thus, in both embodiments solder paste is interposed between the electrode of a die and receiving area 40 prior to the reflow step.

In the preferred embodiment of the present invention, the semiconductor die is a power MOSFET having the same or similar features as that of die 14 in a package according to the prior art. Thus, in the preferred embodiment, the drain electrode of a power MOSFET 14 is electrically and mechanically attached to receiving area 40 of web portion 13 of can 12 to realize a package similar to the prior art package shown by FIGS. 1-4. It should be noted, however, that in a process according to the present invention, an IGBT, a diode, or the like semiconductor die can be used without deviating from the scope and the spirit of the present invention.

In one embodiment of the present invention, frame 38 may be printed on web portion 13 of can 12 through stencil printing. In another embodiment of the present invention, drop-on-demand deposition may be used to print solder mask frame 38. U.S. patent application Ser. No. 11/367,725, assigned to the assignee of the present invention and incorporated herein by reference discloses drop-on-demand deposition as applied in the semiconductor package fabrication arts.

Essentially, frame 38 can be printed by a print head using drop-on-demand deposition as disclosed in U.S. patent application Ser. No. 11/367,725.

Drop-on-demand deposition is advantageous in that it can be used to print images accurately on irregular (i.e. not flat) surfaces. Furthermore, compared to other methods (e.g. stenciling, or blanket deposition/photoimaging) drop-on-demand deposition is less wasteful, and requires fewer steps.

A process according to the present invention is particularly useful when high positional accuracies are required. Specifically, when solder paste mass 42 is reflown, the liquid solder reticulates from solder resist frame 38 whereby the liquid solder spread can be contained. That is, due to the surface tension the solder liquid will only occupy the aperture within frame 38. It also draws the solderable surface of the die to it whereby the die position can be held within the perimeter of frame 38.

A process according to the present invention may also prevent solder spread or shorting from stray solder in some applications, and is, therefore, useful as an aid for manufacturing and customer applications.

In the preferred embodiment, a solder resist material is used to form frame 38. A suitable solder resist may be a polymer based solder resist that is capable of deposition by drop-on-demand deposition.

According to an alternative embodiment, the polymer-based solder resist frame 38 can be replaced with a passivated surface inside can 12. For example, receiving area 40 may be masked with an oxidation retardant substance, and the remaining area can be oxidized to act as a passivation and/or solder mask. Thereafter, the oxidation retardant mask can be removed leaving receiving area 40 surrounded by a passivated frame which is treated to act as a solder resist or solder stop.

Figure 10:
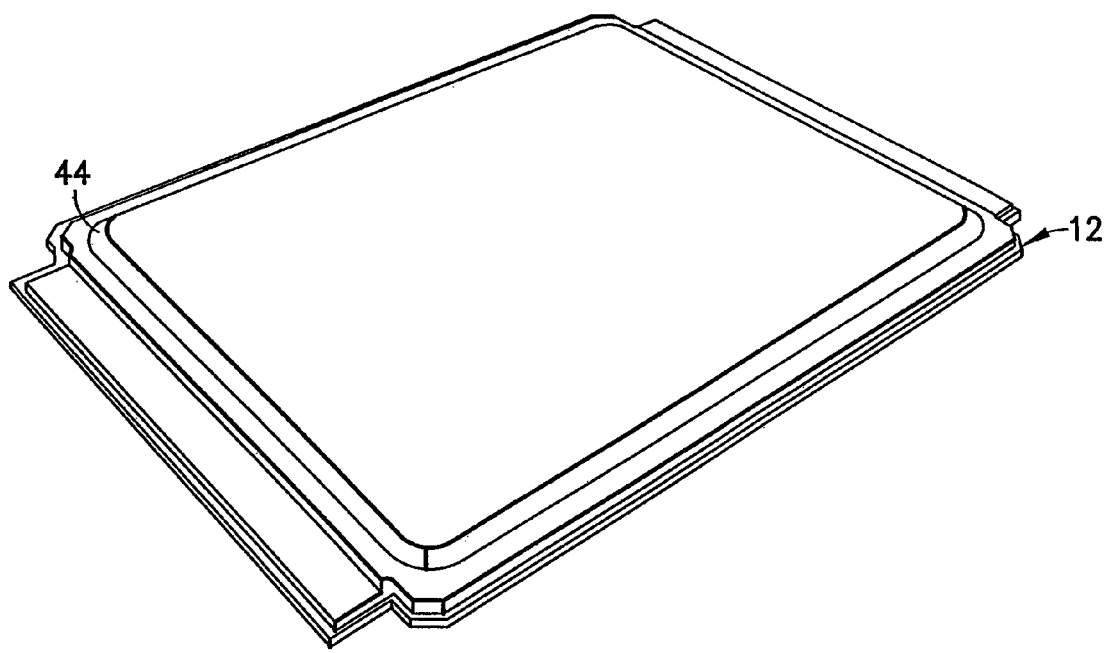
FIG. 10 shows a perspective view of the exterior of a can after being coated with a dielectric.

Referring to FIG. 10, in another embodiment of the present invention, the exterior surface of can 12 may be coated with a high thermal absorption dielectric 44. Preferably, dielectric 44 is a polymer. As a further enhancement dielectric 44 may include pigments to further improve the thermal performance thereof. Specifically, in a prior art package can 12 is coated with a reflective material such as silver, which has low rate of infra-red absorption. Dielectric 44, and specifically dielectric 44 pigmented with black or dark pigments will increase infra-red absorption. Increased infra-red absorption can be advantageous when an older, less efficient reflow oven is used to reflow solder paste mass 42. Dielectric 44 can be deposited through any known method, including drop-on-demand deposition.

Can 12 in a method according to the present invention may be made from copper, or a copper alloy, and is preferably coated with gold or silver. Similar to the prior art, can 12 may include web portion 13, surrounding wall 15, and rails 32. It should be noted that dielectric 44 is preferably applied before the application of solder mask frame 38 and attachment of the die.

A process according to the present invention is further advantageous in that it is fully customizable. That is, the process parameters can be changed to achieve any particular end result without substantially changing the fundamental aspects of the process.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor package, comprising:
  a conductive can having an interior surface for receiving a power semiconductor die;
  said power semiconductor die having a first power electrode electrically and mechanically attached to said interior surface by a conductive adhesive; and
  a high thermal and high infra-red absorption dielectric disposed on an exterior surface of said conductive can; wherein said dielectric enables high thermal conduction to said conductive adhesive during attachment.

2. The package of claim 1, wherein said dielectric is comprised of a polymer.

3. The package of claim 1, wherein said semiconductor die is one of a power MOSFET, an IGBT, and a diode.

4. The package of claim 1, wherein said dielectric is a pigmented polymer.

5. The package of claim 1, wherein said dielectric is drop-on-demand deposited on said exterior surface of said conductive can.

6. The package of claim 1, further comprising a frame inside said conductive can to define a receiving area on said interior surface for receiving said power semiconductor die, said frame being unwettable by solder in liquid phase.

7. The package of claim 6, wherein said frame is comprised of solder resist.

8. The package of claim 6, wherein said frame is comprised of a passivation material.

9. A power semiconductor package, comprising:
  a conductive can having a frame to define an interior surface for receiving a power semiconductor die, wherein said conductive can includes a web portion and a wall surrounding said web portion, and wherein said frame is formed on said web portion between said wall and said interior surface, whereby said frame surrounds said interior surface;

a power semiconductor die having a first power electrode electrically and mechanically attached to said interior surface by a conductive adhesive; and a high thermal absorption dielectric disposed on the exterior surface of said conductive can.

10. The package of claim 9, wherein said semiconductor die is one of a power MOSFET, an IGBT, and a diode.

11. The package of claim 9, wherein said dielectric is comprised of a polymer.

12. The package of claim 9, wherein said dielectric is a pigmented polymer.

13. The package of claim 9, wherein said dielectric is drop-on-demand deposited on said exterior surface of said conductive can.

14. The package of claim 9, wherein said frame is unwettable by solder in liquid phase.

15. The package of claim 9, wherein said frame is stencil printed.

* * * * *